(12) United States Patent
Kamijo

(10) Patent No.: US 7,215,145 B2
(45) Date of Patent: May 8, 2007

(54) COMPARATOR CIRCUIT AND POWER SUPPLY CIRCUIT

(75) Inventor: Haruo Kamijo, Suwa (JP)

(73) Assignee: Seiko Epson Corporation (JP)

( * ) Notice: Subject to any disclaimer, the term of this patent is extended or adjusted under 35 U.S.C. 154(b) by 195 days.

(21) Appl. No.: 11/023,098

(22) Filed: Dec. 22, 2004

(65) Prior Publication Data

US 2005/0140427 A1 Jun. 30, 2005

(30) Foreign Application Priority Data

Dec. 25, 2003 (JP) ............................. 2003-429404

(51) Int. Cl.
*H03K 19/0175* (2006.01)
(52) U.S. Cl. .......................................... 326/82; 326/83
(58) Field of Classification Search ............. 326/82–87
See application file for complete search history.

(56) References Cited

U.S. PATENT DOCUMENTS

| 4,188,588 | A | * | 2/1980 | Dingwall ................. 330/253 |
| 5,159,260 | A | * | 10/1992 | Yoh et al. ................. 323/313 |
| 6,426,671 | B1 | * | 7/2002 | Kono ........................ 327/541 |
| 6,882,135 | B2 | * | 4/2005 | Andoh et al. ............. 323/315 |

FOREIGN PATENT DOCUMENTS

| JP | 62-271473 | 11/1987 |
| JP | 3-48924 | 5/1991 |
| JP | 4-163962 | 6/1992 |
| JP | 5-347518 | 12/1993 |
| JP | 07-092203 | 4/1995 |
| JP | 09-105763 | 4/1997 |
| JP | 2000-349609 | 12/2000 |
| JP | 2001-16078 | 1/2001 |

OTHER PUBLICATIONS

Communication from Japanese Patent Office regarding corresponding application, no date.
Communication from Chinese Patent Office re: related application, Jun. 25, 2006.

* cited by examiner

*Primary Examiner*—Don Le
(74) *Attorney, Agent, or Firm*—Harness, Dickey & Pierce, P.L.C.

(57) ABSTRACT

A comparator circuit includes a current mirror circuit, a differential pair, and a first current source between first and second power supply lines. The differential pair includes a first MOS transistor of enhancement mode n-type having a gate electrode at which an input signal is supplied, and a second MOS transistor of depletion mode n-type. A source of the second MOS transistor is connected with a source of the first MOS transistor and a threshold voltage of the second MOS transistor is lower than that of the first MOS transistor. A gate electrode of the first MOS transistor is formed by polycrystalline silicon which contains a p-type impurity. A gate electrode of the second MOS transistor is formed by polycrystalline silicon which contains an n-type impurity and is connected with the first power supply line. An output signal is output based on a drain voltage of the second MOS transistor.

4 Claims, 7 Drawing Sheets

COMPARATOR CIRCUIT AND POWER SUPPLY CIRCUIT

Japanese Patent Application No. 2003-429404 filed on Dec. 25, 2003, is hereby incorporated by reference in its entirety.

BACKGROUND OF THE INVENTION

The present invention relates to a comparator circuit and a power supply circuit using the comparator circuit.

An electronic instrument such as a portable telephone which includes a liquid crystal display (LCD) panel operates using a removable battery as the power supply, for example. If an electric charge remains in a boosting capacitor when the battery is removed, an abnormal display may occur momentarily (display occurs momentarily; momentary operation). Therefore, a display-off operation of controlling the voltage applied to the liquid crystal according to a predetermined sequence is performed when removing the power supply from the electronic instrument.

The display-off operation must be performed when the user or the like suddenly removes the battery when the electronic instrument operates normally in the power-on state. In this case, the electronic instrument monitors the power supply voltage level, and performs the display-off operation when triggered by the monitoring result of the power supply voltage level when the electronic instrument judges that the battery has been removed.

The accuracy of the threshold value for judging that the battery has been removed is important when monitoring the power supply voltage level. If the threshold value is high and is close to the power supply voltage during power-on, the display-off operation starts due to noise or the like. If the threshold value is too low, the timing of judging that the battery has been removed is delayed, whereby the display-off operation cannot be completed.

As described above, when monitoring the power supply voltage level, it is preferable that the accuracy of the threshold value for judging that the battery has been removed be high.

BRIEF SUMMARY OF THE INVENTION

A comparator circuit according to a first aspect of the present invention includes:
 a differential pair which includes:
  a first metal oxide semiconductor (MOS) transistor of enhancement mode n-type having a gate electrode at which an input signal is supplied; and
  a second MOS transistor of depletion mode n-type, a source of the second MOS transistor being connected with a source of the first MOS transistor, and a threshold voltage of the second MOS transistor being lower than a threshold voltage of the first MOS transistor;
 a first current source inserted between a first power supply line and the differential pair, a first power supply voltage being supplied to the first power supply line; and
 a current mirror circuit which is inserted between a second power supply line and the differential pair and generates a drain current of the second MOS transistor corresponding to a drain current of the first MOS transistor, a second power supply voltage being supplied to the second power supply line,
 wherein the gate electrode of the first MOS transistor is formed by polycrystalline silicon which contains a p-type impurity,
 wherein a gate electrode of the second MOS transistor is formed by polycrystalline silicon containing an n-type impurity and is connected with the first power supply line, and
 wherein an output signal is output based on a drain voltage of the second MOS transistor.

A comparator circuit according to a second aspect of the present invention includes:
 a differential pair which includes:
  a first metal oxide semiconductor (MOS) transistor of depletion mode p-type having a gate electrode at which an input signal is supplied; and
  a second MOS transistor of enhancement mode p-type, a source of the second MOS transistor being connected with a source of the first MOS transistor, and an absolute value of a threshold voltage of the second MOS transistor being smaller than an absolute value of a threshold voltage of the first MOS transistor;
 a current mirror circuit which is inserted between a first power supply line and the differential pair and generates a drain current of the second MOS transistor corresponding to a drain current of the first MOS transistor, a first power supply voltage being supplied to the first power supply line; and
 a first current source inserted between a second power supply line and the differential pair, a second power supply voltage being supplied to the second power supply line,
 wherein the gate electrode of the first MOS transistor is formed by polycrystalline silicon which contains an n-type impurity,
 wherein a gate electrode of the second MOS transistor is formed by polycrystalline silicon containing an p-type impurity and is connected with the second power supply line, and
 wherein an output signal is output based on a drain voltage of the second MOS transistor.

A power supply circuit according to a third aspect of the present invention includes:
 any one of the above comparator circuits;
 a logic circuit which is connected with the first and second power supply lines and generates a discharge signal based on an output from the comparator circuit; and
 a booster circuit which is connected with the first and second power supply lines and boosts a voltage difference between the first and second power supply voltages by a charge-pump operation using a capacitor which stores an electric charge,
 wherein the booster circuit includes a discharge switch element for discharging the electric charge in the capacitor into the first power supply line at a time of discharging, and
 wherein the discharge switch element is switch-controlled based on the discharge signal.

DETAILED DESCRIPTION OF THE EMBODIMENT

Figure 1:
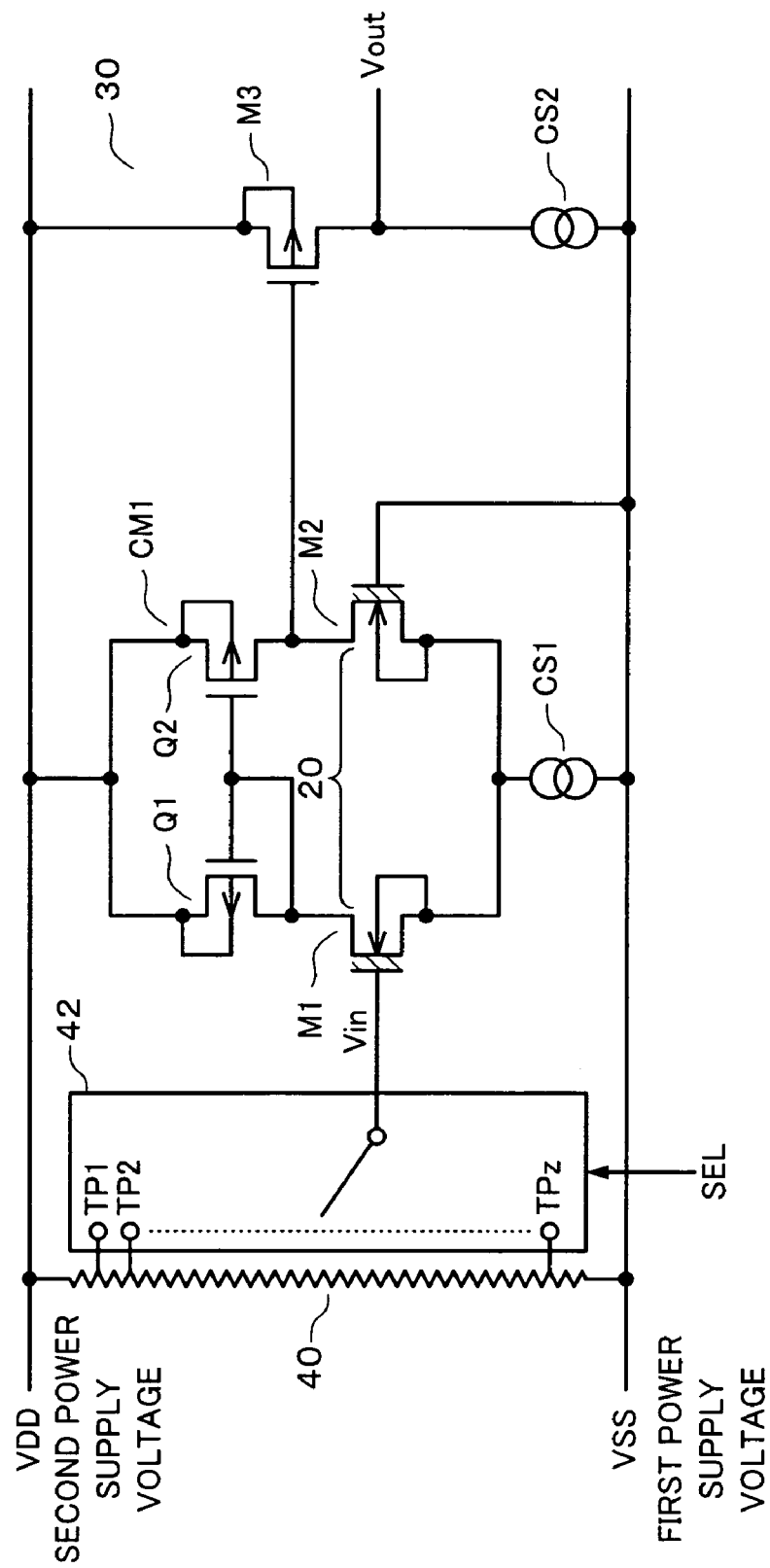
FIG. 1 is a circuit diagram of a configuration of a comparator circuit in one embodiment of the present invention.

An embodiment of the present invention has been achieved in view of the above-described technical problem and may provide a comparator circuit and a power supply circuit which can detect a decrease in the power supply voltage with high accuracy.

A comparator circuit according to one embodiment of the present invention includes:

a differential pair which includes:

a first metal oxide semiconductor (MOS) transistor of enhancement mode n-type having a gate electrode at which an input signal is supplied; and a second MOS transistor of depletion mode n-type, a source of the second MOS transistor being connected with a source of the first MOS transistor, and a threshold voltage of the second MOS transistor being lower than a threshold voltage of the first MOS transistor;

a first current source inserted between a first power supply line and the differential pair, a first power supply voltage being supplied to the first power supply line; and a current mirror circuit which is inserted between a second power supply line and the differential pair and generates a drain current of the second MOS transistor corresponding to a drain current of the first MOS transistor, a second power supply voltage being supplied to the second power supply line, wherein the gate electrode of the first MOS transistor is formed by polycrystalline silicon which contains a p-type impurity, wherein a gate electrode of the second MOS transistor is formed by polycrystalline silicon containing an n-type impurity and is connected with the first power supply line, and wherein an output signal is output based on a drain voltage of the second MOS transistor.

This comparator circuit may include an output circuit which includes:

a third MOS transistor of p-type, the second power supply voltage being supplied at a source of the third MOS transistor, and the drain voltage of the second MOS transistor being applied at a gate electrode of the third MOS transistor; and a second current source inserted between a drain of the third MOS transistor and the first power supply line, and the output signal may be a drain voltage of the third MOS transistor.

According to the present embodiment, whether or not the voltage of the input signal based on the first power supply voltage is higher than the difference in the threshold voltage between the first and second MOS transistors is detected, and the detection result is output as the output signal. A change in the input signal can be detected irrespective of a change in the second power supply voltage. Moreover, the difference in the threshold voltage between the first and second MOS transistors can be adjusted with high accuracy by the manufacturing process technology, and the temperature dependence is significantly small. Therefore, a change in the input signal can be detected with high accuracy by using a simple configuration.

A comparator circuit according to another embodiment of the present invention includes:

a differential pair which includes:

a first metal oxide semiconductor (MOS) transistor of depletion mode p-type having a gate electrode at which an input signal is supplied; and a second MOS transistor of enhancement mode p-type, a source of the second MOS transistor being connected with a source of the first MOS transistor, and an absolute value of a threshold voltage of the second MOS transistor being smaller than an absolute value of a threshold voltage of the first MOS transistor;

a current mirror circuit which is inserted between a first power supply line and the differential pair and generates a drain current of the second MOS transistor corresponding to a drain current of the first MOS transistor, a first power supply voltage being supplied to the first power supply line; and a first current source inserted between a second power supply line and the differential pair, a second power supply voltage being supplied to the second power supply line, wherein the gate electrode of the first MOS transistor is formed by polycrystalline silicon which contains an n-type impurity, wherein a gate electrode of the second MOS transistor is formed by polycrystalline silicon containing an p-type impurity and is connected with the second power supply line, and wherein an output signal is output based on a drain voltage of the second MOS transistor.

This comparator circuit may include an output circuit which includes:

a third MOS transistor of n-type, the first power supply voltage being supplied at a source of the third MOS transistor, and the drain voltage of the second MOS transistor being applied at a gate electrode of the third MOS transistor; and a second current source inserted between a drain of the third MOS transistor and the second power supply line, and the output signal may be a drain voltage of the third MOS transistor.

According to the present embodiment, whether or not the voltage of the input signal based on the first power supply voltage is higher than the difference in the threshold voltage between the first and second MOS transistors is detected, and the detection result is output as the output signal. A change in the input signal can be detected irrespective of a change in the second power supply voltage. Moreover, the difference in the threshold voltage between the first and second MOS transistors can be adjusted with high accuracy by the manufacturing process technology, and the temperature dependence is significantly small. Therefore, a change in the input signal can be detected with high accuracy by using a simple configuration.

With any of these comparator circuits, the input signal may be a divided voltage obtained by dividing a voltage difference between the first and second power supply voltages by using a resistor circuit.

In the present embodiment, the voltage between the first and second power supply voltages is used as the input signal. A change in the input signal can be detected irrespective of a change in the second power supply voltage as described above. Therefore, even when the second power supply voltage decreases, a decrease in the input signal accompanying the decrease in the second power supply voltage can be detected with high accuracy by using a simple configuration.

A power supply circuit according to a further embodiment of the present invention includes:

any one of the above comparator circuits;

a logic circuit which is connected with the first and second power supply lines and generates a discharge signal based on an output from the comparator circuit; and a booster circuit which is connected with the first and second power supply lines and boosts a voltage difference between the first and second power supply voltages by a charge-pump operation using a capacitor which stores an electric charge, wherein the booster circuit includes a discharge switch element for discharging the electric charge in the capacitor into the first power supply line at a time of discharging, and wherein the discharge switch element is switch-controlled based on the discharge signal.

According to the present embodiment, the electric charge stored in the capacitor by the charge-pump operation can be discharged based on a change in the input signal detected with high accuracy by using a simple configuration. Therefore, a power supply circuit which can perform the discharging operation when the power supply is terminated due to removal of the battery and it is undesirable to allow the electric charge to remain in the capacitor, for example.

The embodiments of the present invention are described below in detail with reference to the drawings. Note that the embodiments described hereunder do not in any way limit the scope of the invention defined by the claims laid out herein. Note also that not all of the elements of these embodiments should be taken as essential requirements to the means of the present invention.

FIG. 1 shows a circuit diagram of a configuration of a comparator circuit in one embodiment of the present invention.

A comparator circuit 10 is connected with a first power supply line to which a ground power supply voltage VSS (first power supply voltage) is supplied and a second power supply line to which a logic power supply voltage VDD (second power supply voltage) is supplied. The comparator circuit 10 detects whether or not the voltage of the logic power supply voltage VDD is decreased with respect to the ground power supply voltage VSS. In more detail, the comparator circuit 10 detects whether or not the voltage of an input signal Vin based on the ground power supply voltage VSS is greater than the difference in threshold voltage between two metal oxide semiconductor (MOS) transistors which make a differential pair, and outputs the detection result as an output signal Vout.

The comparator circuit 10 includes a differential pair 20, a first current source CS1, and a current mirror circuit CM1.

The differential pair 20 includes an n-type (first conductivity type) first MOS transistor M1 and an n-type second MOS transistor M2. Sources of the first and second MOS transistors M1 and M2 are connected. The first MOS transistor M1 is an enhancement mode transistor, and the input signal Vin is applied to a gate electrode of the first MOS transistor M1. The second MOS transistor M2 is a depletion mode transistor, and the threshold voltage of the second MOS transistor M2 is set to be lower than the threshold voltage of the first MOS transistor M1.

A gate electrode of the first MOS transistor M1 is formed by polycrystalline silicon (polysilicon) which contains a p-type (second conductivity type) impurity. A gate electrode of the second MOS transistor M2 is formed by polycrystalline silicon which contains an n-type impurity, and the gate electrode is connected with the first power supply line.

The first current source CS1 is inserted between the first power supply line and the differential pair 20. In more detail, one end of the first current source CS1 is connected with the first power supply line, and the other end is connected with the sources of the first and second MOS transistors M1 and M2 which make up the differential pair 20.

The current mirror circuit CM1 is inserted between the second power supply line and the differential pair 20. In more detail, one end of the current mirror circuit CM1 is connected with the second power supply line, and the other end is connected with drains of the first and second MOS transistors M1 and M2 which make up the differential pair 20. The current mirror circuit CM1 generates a drain current of the second MOS transistor M2 corresponding to a drain current of the first MOS transistor M1.

The current mirror circuit CM1 may include p-type first and second current mirror MOS transistors Q1 and Q2. Sources of the first and second current mirror MOS transistors Q1 and Q2 are connected with the second power supply line. A gate electrode of the first current mirror MOS transistor Q1 and a gate electrode of the second current mirror MOS transistor Q2 are connected, and the gate electrode and a drain of the first current mirror MOS transistor Q1 are connected. The drain of the first current mirror MOS transistor Q1 is connected with the drain of the first MOS transistor M1. A drain of the second current mirror MOS transistor Q2 is connected with a drain of the second MOS transistor M2.

The comparator circuit 10 having such a configuration outputs the output signal Vout based on a drain voltage of the second MOS transistor M2.

The first and second MOS transistors M1 and M2 which make up the differential pair 20 are described below.

The p-type first and second current mirror MOS transistors Q1 and Q2 of the first current mirror circuit CM1 which makes up the comparator circuit 10 shown in FIG. 1 are formed on a p-type silicon substrate (semiconductor substrate in a broad sense). An n-type well region is formed in the silicon substrate, and two p+ diffusion layers which become the source region and the drain region and an n+ diffusion layer for applying a substrate potential are formed in the n-type well region. An insulating film made of silicon oxide is formed on a predetermined region of the n-type well region which becomes a channel region, and a gate electrode made of polycrystalline silicon is formed on the insulating film.

The first and second MOS transistors M1 and M2 which make up the comparator circuit 10 shown in FIG. 1 are formed in the silicon substrate. Specifically, two n+ diffusion layers which become the source region and the drain region and a p+ diffusion layer for applying a substrate potential are formed in the silicon substrate. An insulating film made of silicon oxide is formed on a predetermined region of the silicon substrate which becomes a channel region, and a gate electrode made of polycrystalline silicon is formed on the insulating film.

The gate electrode of the first MOS transistor M1 is formed by polycrystalline silicon containing a p-type impurity. Therefore, the polarity is a p-type. The gate electrode of the second MOS transistor M2 is formed by polycrystalline silicon containing an n-type impurity. Therefore, the polarity is an n-type. This produces the difference in threshold voltage between the first and second MOS transistors M1 and M2.

The threshold voltage Vthn of the n-type MOS transistor is expressed by the following equation (1).

$$Vthn = 2\psi_F + (\phi_M - \phi_S) + Q_{SS}/Cox + Q_B/Cox \quad (1)$$

In the equation (1), $\psi_F$ denotes the Fermi level of the silicon substrate, $\phi_M$ denotes the work function of the gate electrode, $\phi_S$ denotes the work function of the silicon substrate, $Q_{SS}$ denotes the amount of interfacial charge between the silicon substrate and the oxide film, $Q_B$ denotes the amount of charge on the surface of the silicon substrate, and Cox denotes the capacity of the gate insulating film.

As is clear from the equation (1), even if the physical structures (channel length which is the length of the channel region in the direction from the source to the drain, or the channel width which is the length of the channel region in the direction which intersects the direction from the source to the drain at right angles, for example) of the n-type first and second MOS transistors M1 and M2 are the same, the threshold voltages can be caused to differ. This is because the work function $\phi_M$ of the gate electrode is changed by causing the polarities of the gate electrodes of the first and second MOS transistors M1 and M2 to differ.

In this case, the work function $\phi_M$ of the gate electrode can be adjusted by changing the concentration of the impurity injected into the gate electrode. The work function $\phi_S$ of the silicon substrate can be adjusted by adjusting the impurity concentration of the silicon substrate. This allows the first MOS transistor M1 to become an enhancement mode transistor (Vthn>0) and the second MOS transistor M2 to impurity a depletion mode transistor (Vthn<0).

The work function $\phi_M$ of the gate electrode is uniquely determined by the material for the gate electrode. The work function $\phi_S$ of the silicon substrate is uniquely determined if the impurity distribution is constant. Therefore, when forming the gate electrode using polycrystalline silicon, the work function $\phi_M$ of the gate electrode is changed by changing the impurity concentration of the gate electrode. When comparing the work function $\phi_{Mp}$ of the gate electrode when the polarity of the gate electrode is p-type with the work function $\phi_{Mn}$ of the gate electrode when the polarity of the gate electrode is n-type, the work function is greater when the polarity of the gate electrode is p-type. Specifically, the relationship shown by the following equation (2) is satisfied between the work functions $\phi_{Mp}$ and $\phi_{Mn}$ of the gate electrodes.

$$\phi_{Mp} - \phi_{Mn} > 0 \quad (2)$$

The threshold voltage Vthn1 of the first MOS transistor M1 is expressed by the following equation (3).

$$Vthn1 = 2\psi_F + (\phi_{Mp} - \phi_S) + Q_{SS}/Cox + Q_B/Cox \quad (3)$$

The threshold voltage Vthn2 of the second MOS transistor M2 is expressed by the following equation (4).

$$Vthn2 = 2\psi_F + (\phi_{Mn} - \phi_S) + Q_{SS}/Cox + Q_B/Cox \quad (4)$$

The following equation (5) is obtained from the equations (2) to (4).

$$Vthn1 - Vthn2 = \phi_{Mp} - \phi_{Mn} > 0 \quad (5)$$

Therefore, the threshold voltage Vthn1 of the first MOS transistor M1 is greater than the threshold voltage Vthn2 of the second MOS transistor M2.

Since the second MOS transistor M2 is a depletion mode transistor, a drain current flows even if the gate-source voltage is 0. When the gate-source voltage of the second MOS transistor M2 is denoted by Vgs2, the threshold voltage is denoted by Vthn2, and the drain-source voltage is denoted by Vds2, the second MOS transistor M2 operates normally in the range in which the logic power supply voltage VDD is applied so that the relationship Vgs2−Vthn2>Vds2 is satisfied, specifically, operates in the saturation region.

In this case, the drain current Id of the n-type MOS transistor is expressed by the following equation (6).

$$Id = \beta/2(Vgs - Vthn)^2 \quad (6)$$

In the equation (6), $\beta$ denotes a constant determined by the manufacturing process. Vgs denotes the gate-source voltage. Vthn denotes the threshold voltage.

Therefore, the drain current I2 of the second MOS transistor M2 is expressed by the following equation (7).

$$I2 = \beta/2(VSS - Vs - Vthn2)^2 \quad (7)$$

In the equation (7), Vs denotes the source voltage of the second MOS transistor M2.

If the first MOS transistor M1 also operates in the saturation region, the drain current I1 of the first MOS transistor M1 is expressed by the following equation (8).

$$I1 = \beta/2(Vin - Vs - Vthn1)^2 \quad (8)$$

The first current mirror circuit CM1 generates the drain current I2 of the second MOS transistor M2 corresponding to the drain current I1 of the first MOS transistor M1. When the first MOS transistor M1 of which the gate-source voltage is increased by the input signal Vin operates in the saturation region with respect to the second MOS transistor M2 of which the gate-source voltage is fixed, I1≧I2 is satisfied. Therefore, the following equation (9) is obtained.

$$Vin - VSS \geq Vthn1 - Vthn2 \quad (9)$$

Specifically, the equation (9) shows the condition when the first and second MOS transistors M1 and M2 which make up the differential pair 20 operate in the saturation region. This means that the comparator circuit can be operated, even if the logic power supply voltage VDD changes, by the relationship between the difference between the input signal Vin and the ground power supply voltage VSS and the difference in the threshold voltage between the first and second MOS transistors M1 and M2 which make up the differential pair 20.

In the equation (9), the difference in the threshold voltage between the first and second MOS transistors M1 and M2 (Vthn1−Vthn2) can be set with extremely high accuracy. For example, 1.0 V can be obtained. The temperature characteristics of the threshold voltage of a general MOS transistor are −0.15 to −2%/C.°, for example. On the other hand, the temperature characteristics of the difference in the threshold voltage between the first and second MOS transistors M1 and M2 (Vthn1−Vthn2) are −0.05%/C.°, for example. Specifically, the temperature dependence is extremely small.

Even when the above-described comparator circuit 10 uses the logic power supply voltage VDD as the power supply, the comparator circuit 10 can detect a decrease in the logic power supply voltage VDD with high accuracy using a simple configuration and output the detection result as the output signal Vout by applying the input signal Vin which changes due to a decrease in the logic power supply voltage VDD to the gate electrode of the first MOS transistor M1.

In FIG. 1, the comparator circuit 10 may further include an output circuit 30. The output circuit 30 includes a p-type third MOS transistor M3 and a second current source CS2. The logic power supply voltage VDD (second power supply voltage) is supplied to a source of the third MOS transistor M3, and the drain voltage of the second MOS transistor M2 is applied to a gate electrode of the third MOS transistor M3.

The second current source CS2 is inserted between a drain of the third MOS transistor M3 and the first power supply line. The output circuit 30 outputs the drain voltage of the third MOS transistor M3 as the output signal Vout.

In the comparator circuit 10, the input signal Vin may be a divided voltage obtained by dividing the voltage difference between the logic power supply voltage VDD and the ground power supply voltage VSS (voltage difference between the first and second power supply voltages) using a resistor circuit. For example, a resistor circuit 40 is provided between the first and second power supply lines, and a plurality of terminals TP1 to TPz (z is an integer of two or more) are provided for removing the divided voltage obtained by dividing the voltage between the opposite ends using the resistor circuit 40. The select circuit 42 electrically connects one of the terminals TP1 to TPz with the gate electrode of the first MOS transistor M1 based on the select signal SEL. This enables the divided voltage between the logic power supply voltage VDD and the ground power supply voltage VSS to be used as the input signal Vin, whereby a decrease in the logic power supply voltage VDD can be detected based on the divided voltage.

The operation of the comparator circuit 10 is described below.

In the select circuit 42, one terminal which outputs the divided voltage divided by the resistor circuit 40 is electrically connected with the gate electrode of the first MOS transistor M1 based on the select signal SEL. Therefore, the divided voltage is the input signal Vin.

Suppose that the logic power supply voltage is decreased by sudden removal of the battery which supplies the logic power supply voltage VDD, for example. The voltage of the input signal Vin is decreased accompanying a decrease in the logic power supply voltage VDD.

When Vin≧VSS+(Vthn1−Vthn2), the first MOS transistor M1 operates in the saturation region. Specifically, the impedance of the first MOS transistor M1 is decreased, whereby the drain current of the first MOS transistor M1 is increased. As a result, the drain current of the second MOS transistor M2 which commonly uses the first current source CS1 is decreased, whereby the impedance of the second MOS transistor M2 is increased and the potential of the gate electrode of the third MOS transistor M3 is increased. This decreases the potential of the output signal Vout, whereby the logical level of the output signal Vout becomes L.

When VSS<Vin<VSS+(Vthn1−Vthn2), the first MOS transistor M1 does not operate in the saturation region. Specifically, the impedance of the first MOS transistor M1 is increased, whereby the drain current of the first MOS transistor M1 is decreased. As a result, the drain current of the second MOS transistor M2 is increased, whereby the impedance of the second MOS transistor M2 is decreased and the potential of the gate electrode of the third MOS transistor M3 is decreased. This increases the potential of the output signal Vout, whereby the logical level of the output signal Vout becomes H.

Figure 2:
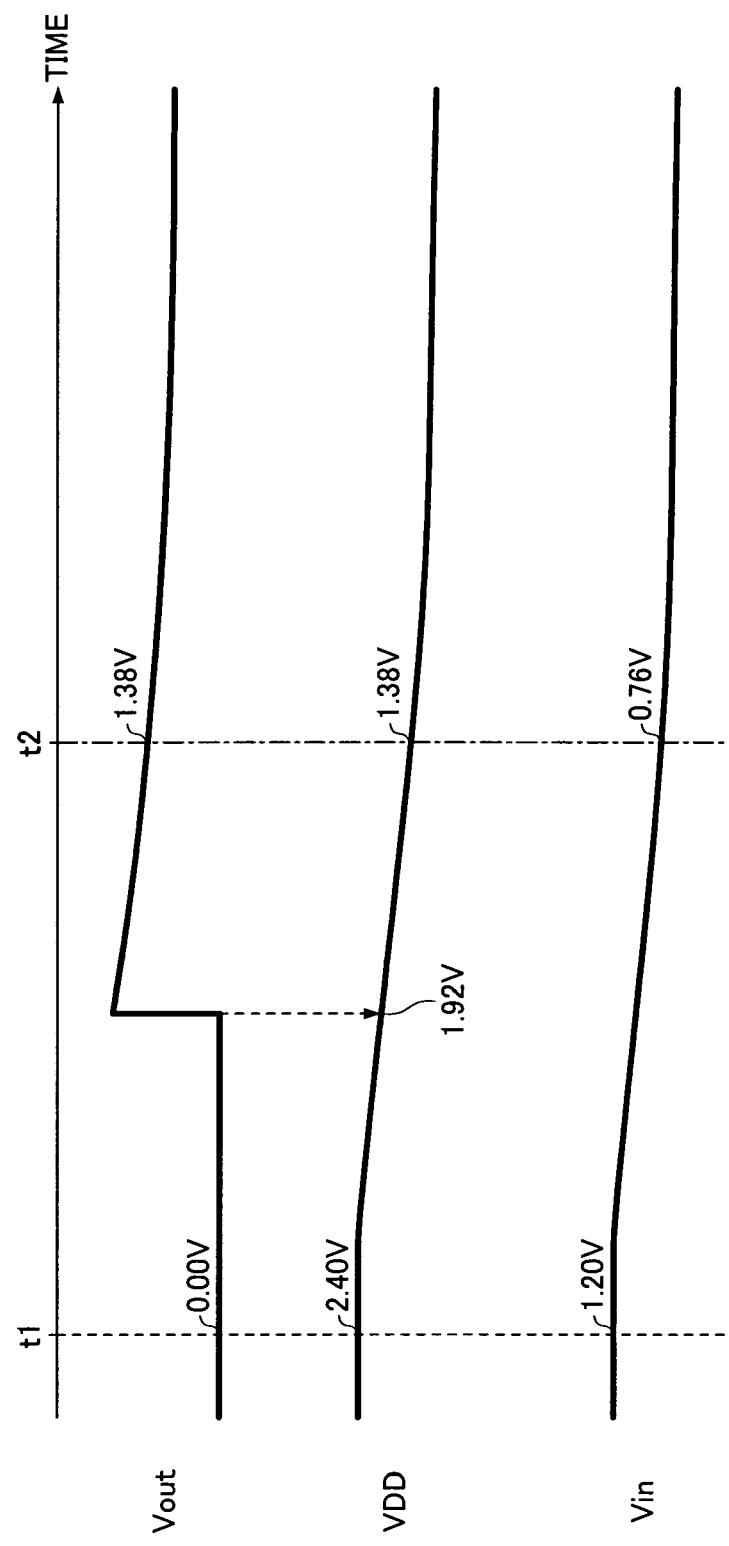
FIG. 2 is a diagram showing a simulation waveform of an operation example of the comparator circuit shown in FIG. 1.

FIG. 2 shows a simulation waveform of an operation example of the comparator circuit shown in FIG. 1.

In FIG. 2, the difference in the threshold voltage (Vthn1−Vthn2) between the first and second MOS transistors M1 and M2 which make up the differential pair 20 is approximately 1.0 V. At a time t1 immediately before the battery is removed, the logic power supply voltage VDD is 2.40 V and the ground power supply voltage VSS is 0.00 V. The voltage of the input signal Vin is set at 1.20 V based on the select signal SEL.

When the power supply is stopped at the time t1 due to removal of the battery, the voltage of the second power supply line to which the logic power supply voltage VDD has been supplied decreases. Since the load connected with the second power supply line is capacitive, the voltage gradually decreases with the lapse of time.

When the voltage of the second power supply line is 1.92 V, specifically, when the input signal Vin is approximately at 0.92 (=1.92−1.0) V, the logical level of the output signal Vout changes from the L level to the H level. Therefore, the processing when the battery is removed can be performed by being triggered by the output signal Vout which has changed to the H level. In FIG. 2, the voltage of the output signal Vout decreases after the output signal Vout has changed to the H level because the voltage of the second power supply line decreases.

An example in which the comparator circuit 10 shown in FIG. 1 is applied to the power supply circuit is described below.

Figure 3:
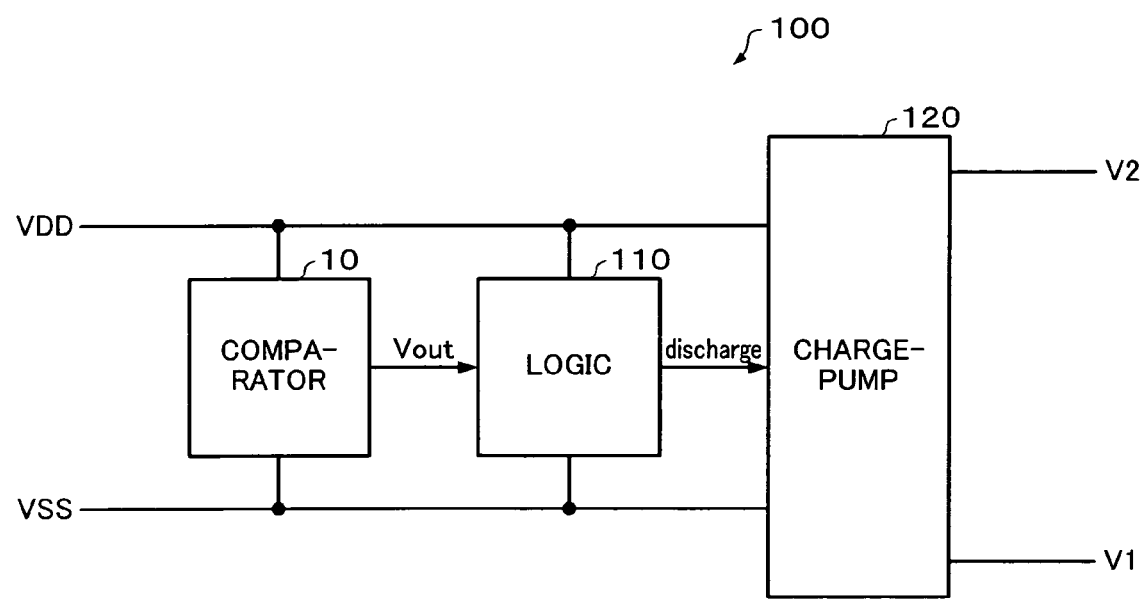
FIG. 3 is a block diagram of a configuration example of a power supply circuit to which the comparator circuit shown in FIG. 1 is applied.

FIG. 3 shows a block diagram of a configuration example of a power supply circuit to which the comparator circuit 10 shown in FIG. 1 is applied. In FIG. 3, sections the same as the sections shown in FIG. 1 are denoted by the same symbols, and description of these sections is appropriately omitted.

A power supply circuit 100 may include the comparator circuit 10, a logic circuit 110, and a charge-pump circuit 120 (booster circuit in a broad sense). The comparator circuit 10 shown in FIG. 3 may have a configuration in which the output circuit 30 is omitted, or may have a configuration in which the resistor circuit 40 and the select circuit 42 are omitted, or may have a configuration in which the output circuit 30, the resistor circuit 40, and the select circuit 42 are omitted.

Figure 4:
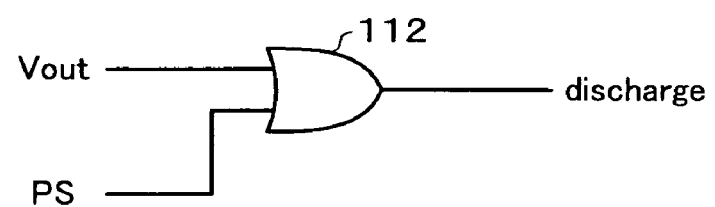
FIG. 4 is a circuit diagram of a configuration example of a logic circuit shown in FIG. 3.

The logic circuit 110 is connected with the first and second power supply lines, and generates a discharge signal based on the output from the comparator circuit 10. The output from the comparator circuit 10 is the output signal Vout. The logic circuit 110 may be formed by a combinational circuit as shown in FIG. 4. In FIG. 4, the logic circuit 110 includes an OR circuit 112 which calculates the logical OR of the output signal Vout and a power save signal PS and outputs a discharge signal discharge. The power save signal PS is generated by the logic circuit 110, for example. The power save signal PS changes to the H level when the power supply circuit 100 suspends the power supply to the power supply target, for example.

The charge-pump circuit 120 is connected with the first and second power supply lines, and increases the voltage difference between the logic power supply voltage VDD and the ground power supply voltage VSS by a charge-pump operation using a capacitor which stores an electric charge. The charge-pump circuit 120 may output the voltage obtained by increasing the voltage difference between the logic power supply voltage VDD and the ground power supply voltage VSS as the voltage between output voltages V1 and V2, for example.

The charge-pump circuit 120 includes a discharge switch element for discharging the electric charge in the capacitor into the ground power supply voltage VSS (first power supply line) at the time of discharging. The discharge switch element is switch-controlled based on the discharge signal generated by the logic circuit 110. Therefore, the electric charge in the capacitor for the charge-pump operation is discharged in the charge-pump circuit 120 based on the output signal Vout from the comparator circuit 10.

The charge-pump circuit 120 may include a regulator circuit, regulate the voltage difference between the logic power supply voltage VDD and the ground power supply voltage VSS, and output the output voltages V1 and V2 by boosting the regulated voltage.

Figure 5:
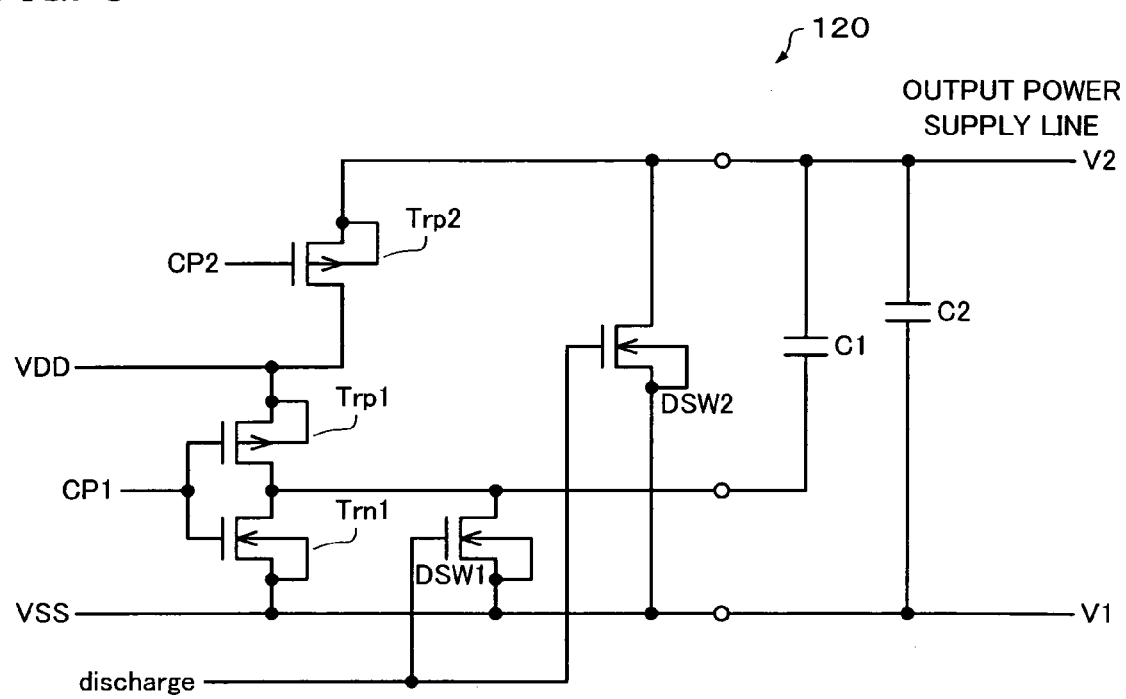
FIG. 5 is a circuit diagram of a configuration example of a charge-pump circuit shown in FIG. 4.

FIG. 5 shows a circuit diagram of a configuration example of the charge-pump circuit 120 shown in FIG. 4.

FIG. 5 shows a configuration example of the charge-pump circuit 120 which doubles the voltage in the positive direction. However, the present invention is not limited thereto.

The charge-pump circuit 120 outputs the voltage boosted by the charge pump operation using a capacitor. The charge-pump circuit 120 includes a plurality of switch elements for performing the charge-pump operation, and a discharge switch element for discharging an electric charge in the capacitor at the time of discharging.

In FIG. 5, the charge-pump circuit 120 includes the capacitor. However, the present invention is not limited thereto. The charge-pump circuit may be formed by a capacitor connected through an external connection terminal, the switch elements, and the discharge switch element. In this case, the charge-pump circuit 120 includes the switch elements and the discharge switch element, and the switch elements and the capacitor are connected through the external connection terminal.

In FIG. 5, a MOS transistor is used as the switch element. The charge-pump circuit 120 shown in FIG. 5 includes a p-type MOS transistor Trp1 and an n-type MOS transistor Trn1 connected in series between the first and second power supply lines. A charge clock signal CP1 is applied to gate electrodes of the MOS transistors Trp1 and Trn1. A p-type MOS transistor Trp2 is inserted between the first power supply line and an output power supply line. A charge clock signal CP2 is applied to a gate electrode of the MOS transistor Trp2.

A discharge switch element DSW1, which is an n-type MOS transistor, is connected between a drain of the MOS transistor Trn1 and the output power supply line. A discharge switch element DSW2, which is an n-type MOS transistor, is connected between the first power supply line and the output power supply line.

The discharge switch element DSW1 is a switch element for discharging an electric charge in a capacitor C1 connected between the drain of the MOS transistor Trn1 and the output power supply line into the ground power supply voltage VSS. The discharge switch element DSW2 is a switch element for discharging an electric charge in a capacitor C2 connected between the first power supply line and the output power supply line into the ground power supply voltage VSS. Specifically, the discharge switch element is connected between one end of the capacitor which contributes to the charge-pump operation and the ground power supply voltage VSS.

The discharge signal discharge generated by the logic circuit 110 is applied to gate electrodes of the discharge switch elements DSW1 and DSW2. In the normal operation of the charge-pump circuit 120, the discharge signal discharge is fixed at the L level, and one end of each capacitor is electrically disconnected from the ground power supply voltage VSS.

Figure 6:
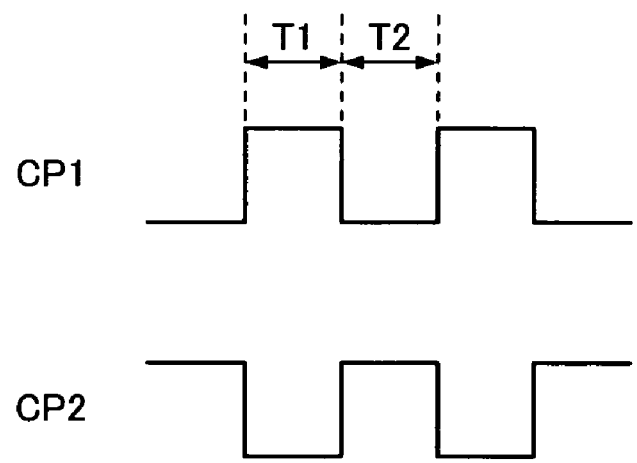
FIG. 6 is a schematic diagram of an operation waveform of a charge clock signal.

FIG. 6 shows a schematic diagram of an operation waveform of the charge clock signals CP1 and CP2. The charge clock signals CP1 and CP2 are clock signals whose phases are reversed.

In the charge-pump circuit 120 to which the charge clock signals CP1 and CP2 are supplied, the MOS transistors Trn1 and Trp2 conduct electricity and the MOS transistor Trp1 does not conduct electricity in a period T1 in which the charge clock signal CP1 is at the H level (charge clock signal CP2 is at the L level). Therefore, one end of the capacitor C1 is electrically connected with the first power supply line, and the other end of the capacitor C1 is electrically connected with the second power supply line. Therefore, an electric charge corresponding to the voltage between the first and second power supply lines is stored in the capacitor C1.

In a period T2 in which the charge clock signal CP2 is at the H level (charge clock signal CP1 is at the L level), the MOS transistor Trp1 conducts electricity and the MOS transistors Trn1 and Trp2 do not conduct electricity. Therefore, one end of the capacitor C1 is electrically connected with the second power supply line. As a result, the voltage of the other end of the capacitor C1 becomes a voltage twice the logic power supply voltage VDD based on the ground power supply voltage VSS of the first power supply line. This voltage is applied to one end of the capacitor C2, which is connected with the first power supply line at the other end, after the periods T1 and T2. The charge-pump circuit 120 outputs the voltage twice the logic power supply voltage VDD based on the ground power supply voltage VSS as the output voltage V2.

The power supply circuit 100 including the charge-pump circuit 120 outputs the voltage corresponding to the electric charge stored in the capacitor. However, there may be a case where it is undesirable to output the voltage corresponding to the electric charge stored in the capacitor when a battery which is the power supply for the power supply circuit 100 and other circuits is suddenly removed. For example, since a liquid crystal deteriorates when the DC component is applied to the liquid crystal, the discharging operation of the capacitor must be immediately performed when it is detected that the battery has been removed.

In FIG. 5, the electric charge in the capacitors C1 and C2 can be discharged by causing the discharge switch elements DSW1 and DSW2 to conduct electricity by the discharge signal discharge using the output signal Vout output from the comparator circuit 10.

The power supply circuit 100 may generate the power supply for a display driver which drives a liquid crystal display panel, electroluminescence, or plasma display device.

The charge-pump circuit 120 shown in FIG. 5 is described taking an example in which the logic power supply voltage VDD is supplied to the second power supply line. However, a voltage VDD1 obtained by regulating the logic power supply voltage VDD using a regulator may be supplied.

In the comparator circuit 10 shown in FIG. 1, the differential pair 20 is formed by the n-type MOS transistors. However, the present invention is not limited thereto.

Figure 7:
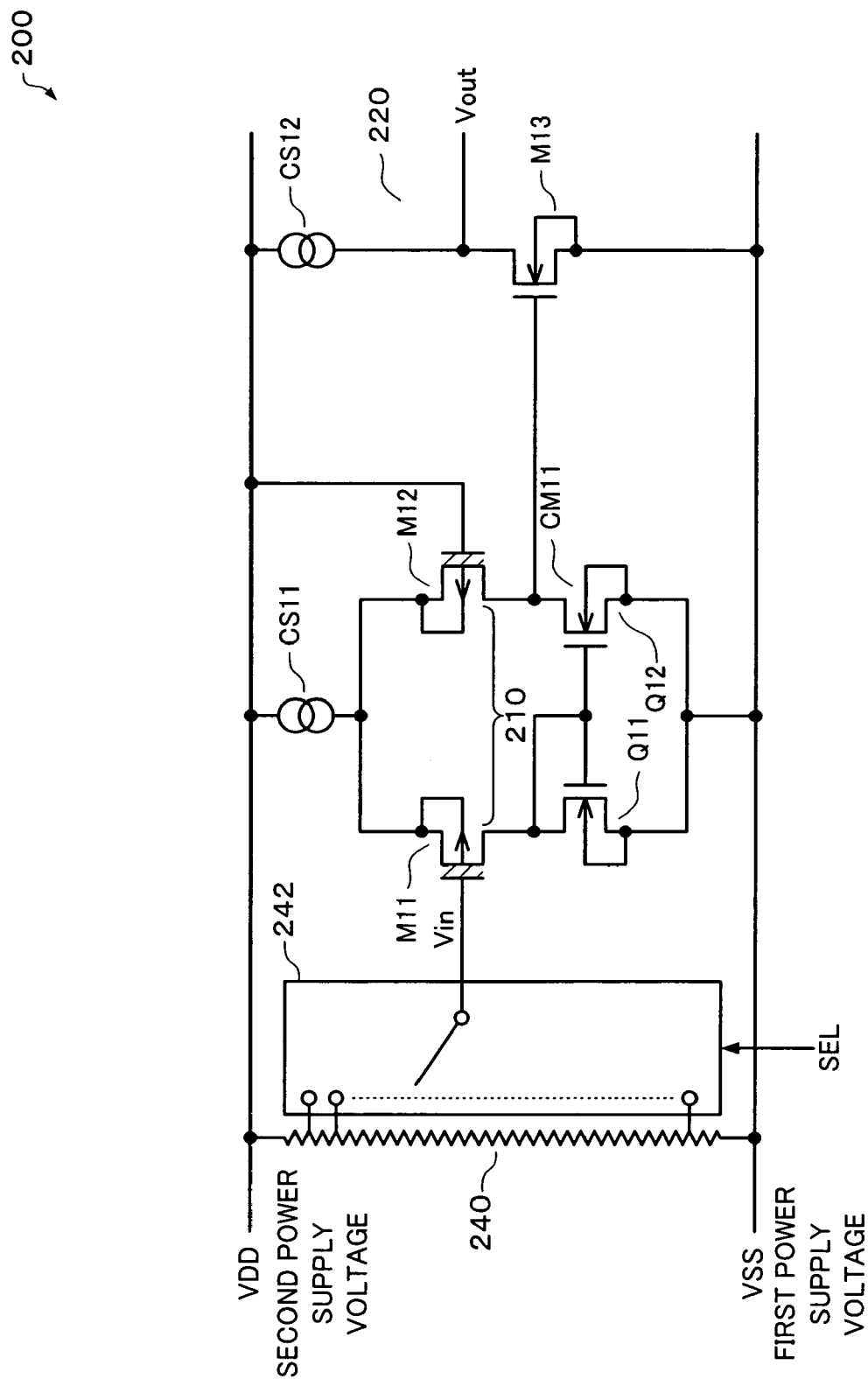
FIG. 7 is a circuit diagram of another configuration example of the comparator circuit shown in FIG. 1.

FIG. 7 shows another configuration example of the comparator circuit shown in FIG. 1.

A comparator circuit 200 shown in FIG. 7 is connected with a first power supply line to which a ground power supply voltage VSS (first power supply voltage) is supplied and a second power supply line to which a logic power supply voltage VDD (second power supply voltage) is supplied.

The comparator circuit 200 includes a differential pair 210, a first current source CS11, and a current mirror circuit CM11.

The differential pair 210 includes a p-type (second conductivity type) first MOS transistor M11 and a p-type second MOS transistor M12. Sources of the first and second MOS transistors M11 and M12 are connected. The first MOS transistor M11 is a depletion mode transistor, and an input signal Vin is applied to a gate electrode of the first MOS transistor M11. The second MOS transistor M12 is an enhancement mode transistor, and the absolute value of the threshold voltage of the second MOS transistor M12 is set to be lower than the absolute value of the threshold voltage of the first MOS transistor M1.

A gate electrode of the first MOS transistor M11 is formed by polycrystalline silicon which contains an n-type impurity. A gate electrode of the second MOS transistor M12 is formed by polycrystalline silicon which contains a p-type impurity, and the gate electrode is connected with the second power supply line.

The first current source CS11 is inserted between the second power supply line and the differential pair 210. In more detail, one end of the first current source CS11 is connected with the second power supply line, and the other end is connected with the sources of the first and second MOS transistors M11 and M12 which make up the differential pair 210.

The current mirror circuit CM11 is inserted between the first power supply line and the differential pair 210. In more detail, one end of the current mirror circuit CM11 is connected with the first power supply line, and the other end is connected with drains of the first and second MOS transistors M11 and M12 which make up the differential pair 210. The current mirror circuit CM11 generates a drain current of the second MOS transistor M12 corresponding to a drain current of the first MOS transistor M11.

The current mirror circuit CM11 may include n-type first and second current mirror MOS transistors Q11 and Q12. Sources of the current mirror first and second MOS transistors Q11 and Q12 are connected with the first power supply line. A gate electrode of the first current mirror MOS transistor Q11 is connected with a gate electrode of the second current mirror MOS transistor Q12, and the gate electrode and a drain of the first current mirror MOS transistor Q11 are connected. The drain of the first current mirror MOS transistor Q11 is connected with a drain of the first MOS transistor M11. A drain of the second current mirror MOS transistor Q12 is connected with a drain of the second MOS transistor M12.

The comparator circuit 200 having such a configuration outputs an output signal Vout based on the drain voltage of the second MOS transistor M12.

The comparator circuit 200 may further include an output circuit 220. The output circuit 220 includes an n-type third MOS transistor M13 and a second current source CS12. The ground power supply voltage VSS (first power supply voltage) is supplied to a source of the third MOS transistor M13, and the drain voltage of the second MOS transistor M12 is applied to a gate electrode of the third MOS transistor M13. The second current source CS12 is inserted between a drain of the third MOS transistor M13 and the second power supply line. The output circuit 220 outputs the drain voltage of the third MOS transistor M13 as the output signal Vout.

In the comparator circuit 200, the input signal Vin may be a divided voltage obtained by dividing the voltage difference between the logic power supply voltage VDD and the ground power supply voltage VSS (voltage difference between the first and second power supply voltages) using a resistor circuit. For example, a resistor circuit 240 is provided between the first and second power supply lines, and a plurality of terminals for removing the divided voltage obtained by dividing the voltage between the opposite ends using the resistor circuit 240 are provided. A select circuit 242 electrically connects one of the terminals with the gate electrode of the first MOS transistor M11 based on a select signal SEL. This enables the divided voltage between the logic power supply voltage VDD and the ground power supply voltage VSS to be used as the input signal Vin, whereby a decrease in the logic power supply voltage VDD can be detected based on the divided voltage.

The comparator circuit 200 shown in FIG. 7 may be formed on an n-type silicon substrate. Since the remaining features are the same as the features of the comparator circuit 10 shown in FIG. 1, further description is omitted.

Part of requirements of any claim of the present invention could be omitted from a dependent claim which depends on that claim. Moreover, part of requirements of any independent claim of the present invention could be made to depend on any other independent claim. Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A power supply circuit comprising:
    a comparator circuit comprising:
        a differential pair which includes:
            a first metal oxide semiconductor (MOS) transistor of enhancement mode n-type having a gate electrode at which an input signal is supplied; and
            a second MOS transistor of depletion mode n-type, a source of the second MOS transistor being connected with a source of the first MOS transistor, and a threshold voltage of the second MOS transistor being lower than a threshold voltage of the first MOS transistor;
        a first current source inserted between a first power supply line and the differential pair, a first power supply voltage being supplied to the first power supply line; and
        a current mirror circuit which is inserted between a second power supply line and the differential pair and generates a drain current of the second MOS transistor corresponding to a drain current of the first MOS transistor, a second power supply voltage being supplied to the second power supply line,
        wherein the pate electrode of the first MOS transistor is formed by polycrystalline silicon which contains a p-type impurity,
        wherein a gate electrode of the second MOS transistor is formed by polycrystalline silicon containing an n-type impurity and is connected with the first power supply line, and
        wherein an output signal is output based on a drain voltage of the second MOS transistor;
    a logic circuit which is connected with the first and second power supply lines and generates a discharge signal based on an output from the comparator circuit; and
    a booster circuit which is connected with the first and second power supply lines and boosts a voltage difference between the first and second power supply voltages by a charge-pump operation using a capacitor which stores an electric charge,
    wherein the booster circuit includes a discharge switch element for discharging the electric charge in the capacitor into the first power supply line at a time of discharging, and wherein the discharging switch element is switch-controlled based on the discharge signal.

2. A power supply circuit comprising:
a comparator circuit comprising:
  a differential pair which includes:
    a first metal oxide semiconductor (MOS) transistor of depletion mode p-type having a gate electrode at which an input signal is supplied; and
    a second MOS transistor of enhancement mode p-type, a source of the second MOS transistor being connected with a source of the first MOS transistor, and an absolute value of a threshold voltage of the second MOS transistor being smaller than an absolute value of a threshold voltage of the first MOS transistor;
  a current mirror circuit which is inserted between a first power supply line and the differential pair and generates a drain current of the second MOS transistor corresponding to a drain current of the first MOS transistor, a first power supply voltage being supplied to the first power supply line; and
  a first current source inserted between a second power supply line and the differential pair, a second power supply voltage being supplied to the second power supply line,
  wherein the gate electrode of the first MOS transistor is formed by polycrystalline silicon which contains an n-type impurity,
  wherein a gate electrode of the second MOS transistor is formed by polycrystalline silicon containing an p-type impurity and is connected with the second power supply line, and wherein an output signal is output based on a drain voltage of the second MOS transistor;
a logic circuit which is connected with the first and second power supply lines and generates a discharge signal based on an output from the comparator circuit; and
a booster circuit which is connected with the first and second power supply lines and boosts a voltage difference between the first and second power supply voltages by a charge-pump operation using a capacitor which stores an electric charge,
wherein the booster circuit includes a discharge switch element for discharging the electric charge in the capacitor into the first power supply line at a time of discharging, and
wherein the discharge switch element is switch controlled based on the discharge signal.

3. A power supply circuit comprising
a comparator circuit comprising:
  a differential pair which includes:
    a first metal oxide semiconductor (MOS) transistor of enhancement mode n-type having a gate electrode at which an input signal is supplied; and
    a second MOS transistor of depletion mode n-type, a source of the second MOS transistor being connected with a source of the first MOS transistor, and a threshold voltage of the second MOS transistor being lower than a threshold voltage of the first MOS transistor;
  a first current source inserted between a first power supply line and the differential pair, a first power supply voltage being supplied to the first power supply line; and
  a current mirror circuit which is inserted between a second power supply line and the differential pair and generates a drain current of the second MOS transistor corresponding to a drain current of the first MOS transistor, a second power supply voltage being supplied to the second power supply line,
  wherein the pate electrode of the first MOS transistor is formed by polycrystalline silicon which contains a p-type impurity,
  wherein a gate electrode of the second MOS transistor is formed by polycrystalline silicon containing an n-type impurity and is connected with the first power supply line, and
  wherein an output signal is output based on a drain voltage of the second MOS transistor;
  wherein the input signal is a divided voltage obtained by dividing a voltage difference between the first and second power supply voltages by using a resistor circuit;
a logic circuit which is connected with the first and second power supply lines and generates a discharge signal based on an output from the comparator circuit; and
a booster circuit which is connected with the first and second power supply lines and boosts a voltage difference between the first and second power supply voltages by a charge-pump operation using a capacitor which stores an electric charge,
wherein the booster circuit includes a discharge switch element for discharging the electric charge in the capacitor into the first power supply line at a time of discharging, and
wherein the discharge switch element is switch-controlled based on the discharge signal.

4. A power supply circuit comprising:
a comparator circuit comprising:
  a differential pair which includes:
    a first metal oxide semiconductor (MOS) transistor of depletion mode p-type having a gate electrode at which an input signal is supplied; and
    a second MOS transistor of enhancement mode p-type, a source of the second MOS transistor being connected with a source of the first MOS transistor, and an absolute value of a threshold voltage of the second MOS transistor being smaller than an absolute value of a threshold voltage of the first MOS transistor;
  a current mirror circuit which is inserted between a first power supply line and the differential pair and generates a drain current of the second MOS transistor corresponding to a drain current of the first MOS transistor, a first power supply voltage being supplied to the first power supply line; and
  a first current source inserted between a second power supply line and the differential pair, a second power supply voltage being supplied to the second power supply line,
  wherein the gate electrode of the first MOS transistor is formed by polycrystalline silicon which contains an n-type impurity,
  wherein a gate electrode of the second MOS transistor is formed by polycrystalline silicon containing an p-type impurity and is connected with the second power supply line, and wherein an output signal is output based on a drain voltage of the second MOS transistor;
  wherein the input signal is a divided voltage obtained by dividing a voltage difference between the first and second power supply voltages by using a resistor circuit;

a logic circuit which is connected with the first and second power supply lines and generates a discharge signal based on an output from the comparator circuit; and a booster circuit which is connected with the first and second power supply lines and boosts a voltage difference between the first and second power supply voltages by a charge-pump operation using a capacitor which stores an electric charge, wherein the booster circuit includes a discharge switch element for discharging the electric charge in the capacitor into the first power supply line at a time of discharging, and wherein the discharge switch element is switch-controlled based on the discharge signal.

* * * * *